US012757438B2

(12) United States Patent
Pandey et al.

(10) Patent No.: US 12,757,438 B2
(45) Date of Patent: Oct. 6, 2026

(54) TRENCH POWER SEMICONDUCTOR DEVICE AND METHOD FOR MANUFACTURING SAME

(71) Applicant: Microchip Technology Incorporated, Chandler, AZ (US)

(72) Inventors: Shesh Mani Pandey, Gilbert, AZ (US); Randy L. Yach, Phoenix, AZ (US); Bruce Odekirk, Portland, OR (US)

(73) Assignee: Microchip Technology Incorporated, Chandler, AZ (US)

(*) Notice: Subject to any disclaimer, the term of this patent is extended or adjusted under 35 U.S.C. 154(b) by 316 days.

(21) Appl. No.: 18/738,741

(22) Filed: Jun. 10, 2024

(65) Prior Publication Data

US 2025/0185286 A1 Jun. 5, 2025

Related U.S. Application Data

(60) Provisional application No. 63/606,562, filed on Dec. 5, 2023.

(51) Int. Cl.

| | |
|---|---|
| ***H01L 29/78*** | (2006.01) |
| ***H10D 30/01*** | (2025.01) |
| ***H10D 30/66*** | (2025.01) |
| ***H10D 62/832*** | (2025.01) |
| ***H10D 62/834*** | (2025.01) |

(52) U.S. Cl.

CPC ....... *H10D 30/668* (2025.01); *H10D 30/0297* (2025.01); *H10D 62/8325* (2025.01); *H10D 62/834* (2025.01)

(58) Field of Classification Search

CPC ............... H10D 30/668; H10D 62/834; H10D 62/8325; H10D 30/0297

See application file for complete search history.

(56) References Cited

U.S. PATENT DOCUMENTS

2021/0119039 A1* 4/2021 Miida ................ H10D 30/0297

FOREIGN PATENT DOCUMENTS

| | | |
|---|---|---|
| DE | 19641839 A1 | 5/1997 |
| JP | H09199721 A | 7/1997 |

OTHER PUBLICATIONS

International Search Report and the Written Opinion of the International Searching Authority, PCT/US2024/034460, Jun. 18, 2024, European Patent Office.

* cited by examiner

*Primary Examiner* — William C Trapanese

(74) *Attorney, Agent, or Firm* — Shumaker, Loop & Kendrick, LLP; Ryan M. Corbett

(57) ABSTRACT

A trench power semiconductor device comprising a silicon carbide drain layer, a silicon carbide drift layer over the silicon carbide drain layer and a first silicon layer over the silicon carbide drift layer. A second silicon layer over the first silicon layer with a source silicon carbide layer over the second silicon layer. A trench formed through the source silicon carbide layer, through the second silicon layer and into at least partially the first silicon layer. A gate terminal contact formed on the trench with a drain terminal contact formed on the silicon carbide drain layer.

20 Claims, 6 Drawing Sheets

TRENCH POWER SEMICONDUCTOR DEVICE AND METHOD FOR MANUFACTURING SAME

CROSS-REFERENCE TO RELATED APPLICATION

The present application claims priority to U.S. Provisional Patent Application No. 63/606,562, filed on Dec. 5, 2023, the contents of which are hereby incorporated by reference in their entirety.

TECHNICAL FIELD

The present disclosure relates generally to semiconductor devices, and more specifically to a trench power semiconductor device having a hybrid trench that includes silicon carbide and silicon, and a method for manufacturing same.

SUMMARY

According to an aspect of one or more examples, there is provided a trench power semiconductor device comprising a silicon carbide drain layer, a silicon carbide drift layer over the silicon carbide drain layer, a first silicon layer over the silicon carbide drift layer, a second silicon layer over the first silicon layer, a source silicon carbide layer over the second silicon layer, a trench formed through the source silicon carbide layer, through the second silicon layer and into at least partially the first silicon layer, a gate terminal contact formed on the trench, and a drain terminal contact formed on the silicon carbide drain layer. The silicon carbide drain layer may comprise silicon carbide having a first concentration of a first type dopant. The silicon carbide drift layer may comprise silicon carbide having a second concentration of the first type dopant. The first concentration of the first type dopant may be greater than the second concentration of the first type dopant. The first silicon layer may comprise silicon having a third concentration of the first type dopant. The second silicon layer may comprise silicon having a fourth concentration of a second type dopant. The source silicon carbide layer may comprise silicon carbide having a fifth concentration of the first type dopant. The fifth concentration of the first type dopant may be greater than the third concentration of the first type dopant. The device may comprise a body having a sixth concentration of the second type dopant. The sixth concentration of the second type dopant may be greater than the fourth concentration of the second type dopant.

According to an aspect of one or more examples, there is provided a method of manufacturing a trench power semiconductor device. The method may include forming a silicon carbide drain layer, forming a silicon carbide drift layer over the silicon carbide drain layer, forming a first silicon layer over the silicon carbide drift layer, forming a second silicon layer over the first silicon layer, forming a source silicon carbide layer over the second silicon layer, forming a trench through the source silicon carbide layer, through the second silicon layer and into at least partially the first silicon layer, forming a gate terminal contact on the trench, and forming a drain terminal contact on the silicon carbide drain layer. The silicon carbide drain layer may comprise silicon carbide having a first concentration of a first type dopant. The silicon carbide drift layer may comprise silicon carbide having a second concentration of the first type dopant. The first concentration of the first type dopant may be greater than the second concentration of the first type dopant. The first silicon layer may comprise silicon having a third concentration of the first type dopant. The second silicon layer may comprise silicon having a fourth concentration of a second type dopant. The source silicon carbide layer may comprise silicon carbide having a fifth concentration of the first type dopant. The fifth concentration of the first type dopant may be greater than the third concentration of the first type dopant. The device may comprise a body having a sixth concentration of the second type dopant. The sixth concentration of the second type dopant may be greater than the fourth concentration of the second type dopant.

DETAILED DESCRIPTION OF VARIOUS EXAMPLES

Figure 1:
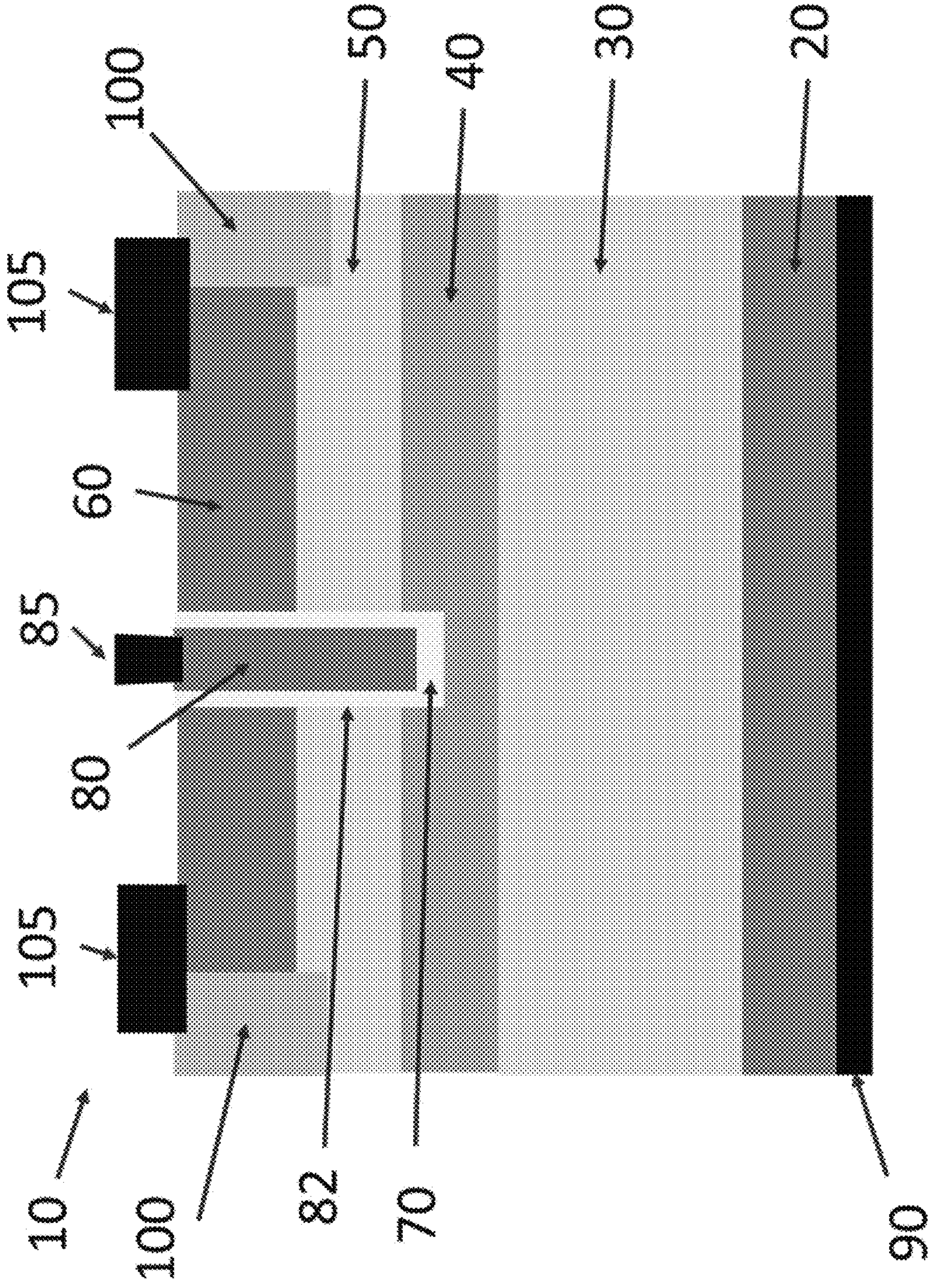
FIG. 1 shows a trench power semiconductor device according to one or more examples.

Reference will now be made in detail to the following various examples, which are illustrated in the accompanying drawings, wherein like reference numerals refer to like elements throughout. The following examples may be embodied in various forms without being limited to the examples set forth herein.

Silicon carbide (SiC) is often used as a substrate to create many semiconductor devices, and may result in reduced switching losses, higher power density, improved heat dissipation, and increased bandwidth as compared with other materials. For example SiC is often used in metal-oxide-semiconductor field-effect transistors (MOSFETs), including trench MOSFETs. However, electron mobility in SiC is relatively low and results in a higher resistance that may be unsuitable for certain applications. Therefore, there is a need for a semiconductor device that that may improve carrier mobility and reduce resistance.

FIG. 1 shows a trench power semiconductor device 10 according to one or more examples. The trench power semiconductor device 10 shown in FIG. 1 may include a SiC drain layer 20, which may comprise silicon carbide having a first concentration of a first type dopant. The trench power semiconductor device 10 of FIG. 1 may include a SiC drift layer 30 formed on the SiC drain layer 20. The SiC drift layer 30 may comprise silicon carbide having a second concentration of the first type dopant. The second concentration may be different from the first concentration. The first concentration of the first type dopant in the SiC drain layer 20 may be greater than the second concentration of the first type dopant in the SiC drift layer 30. A first silicon (Si) layer 40 may be formed on the SiC drift layer 30. The first silicon layer 40 may comprise silicon having a third concentration of the first type dopant. The third concentration may be different from the first concentration. The trench power semiconductor device 10 of FIG. 1 may also include a second silicon layer 50 which may comprise silicon having a fourth concentration of a second type dopant.

The trench power semiconductor device 10 of FIG. 1 may also include a source SiC layer 60 which may comprise silicon carbide having a fifth concentration of the first type dopant. The fifth concentration of the first type dopant in the source SiC layer 60 may be greater than the third concentration of the first type dopant in the first silicon layer 40. The doping concentration in source SiC layer 60 and SiC drain layer 20 may respectively be high enough (e.g., >1E18) to enable good ohmic contact formation.

A trench 70 may be formed through the source SiC layer 60, through the second silicon layer 50 and at least partially into the first silicon layer 40 using any suitable etching process. A gate oxide layer 82 may be deposited within the trench 70 so that the gate oxide layer 82 may line the inner edge of the trench 70. A gate 80 may be formed by depositing polysilicon within the trench 70 and on the deposited gate oxide layer 82.

The trench power semiconductor device 10 of FIG. 1 may also include one or more bodies 100. As shown in FIG. 1, two bodies 100 may be formed on opposite ends of the source SiC layer 60. The bodies 100 may be implanted in the source SiC layer 60, and may also extend at least partially into the second silicon layer 50. The bodies 100 may have a sixth concentration of the second type dopant. The sixth concentration may be different from the fourth concentration. The sixth concentration of the second type dopant in the bodies 100 may be greater than the fourth concentration of the second type dopant in the second silicon layer 50.

The trench power semiconductor device 10 of FIG. 1 may also include at least one gate terminal contact 85 formed on the gate 80, and a drain terminal contact 90 formed on the SiC drain layer 20, the drain terminal contact 90 formed on an opposing face of SiC drain layer 20 from SiC drift layer 30. The trench power semiconductor device 10 of FIG. 1 may also include at least one source terminal contact 105 formed adjacent to a respective at least one body 100.

The trench 70 created in the source SiC layer 60, the second silicon layer 50 and the first silicon layer 40 create a channel by which charge carriers flow from the source SiC layer 60 to the drain terminal 90. The use of silicon for the first silicon layer 40 and the second silicon layer 50 with silicon carbide for the source SiC layer 60 creates a hybrid channel. Silicon has greater electron mobility than silicon carbide which may result in the hybrid channel being able to accommodate higher current and having a lower resistance than a channel having only silicon carbide.

The first type dopant is different from the second type dopant. The first type dopant may be an N-type dopant with the second type dopant being a P-type dopant. Alternatively, the first type dopant may be a P-type dopant with the second type dopant being an N-type dopant.

FIGS. 2A through 2E show a method of manufacturing a trench power semiconductor device 10 according to one or more examples. Although the example method shown in FIGS. 2A-2E include steps shown in a particular order, the steps may be performed in a different order, and may include additional steps that are not explicitly shown.

Figure 2A:
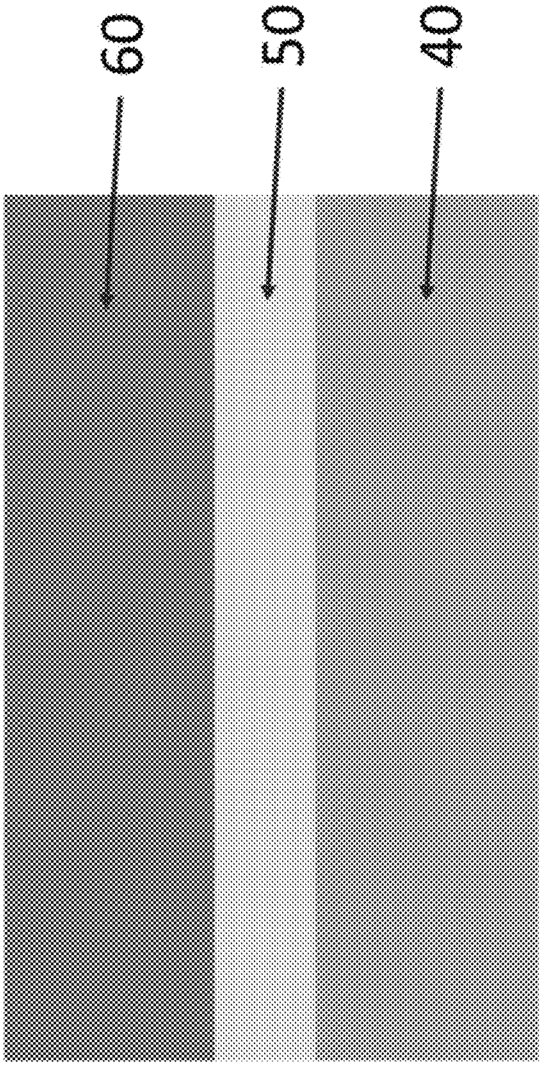
FIGS. 2A through 2E show a method of manufacturing a trench power semiconductor device according to one or more examples.

In FIG. 2A, the second silicon layer 50 may be grown on the first silicon layer 40. In addition, the source SiC layer 60 may be grown on the second silicon layer 50. According to one or more examples, the first silicon layer 40 may comprise silicon having a third concentration of the first type dopant and the source SiC layer 60 may comprise silicon carbide having a fifth concentration of the first type dopant. The fifth concentration of the first type dopant in the source SiC layer 60 may be greater than the third concentration of silicon of the first type dopant in the first silicon layer 40.

Figure 2B:
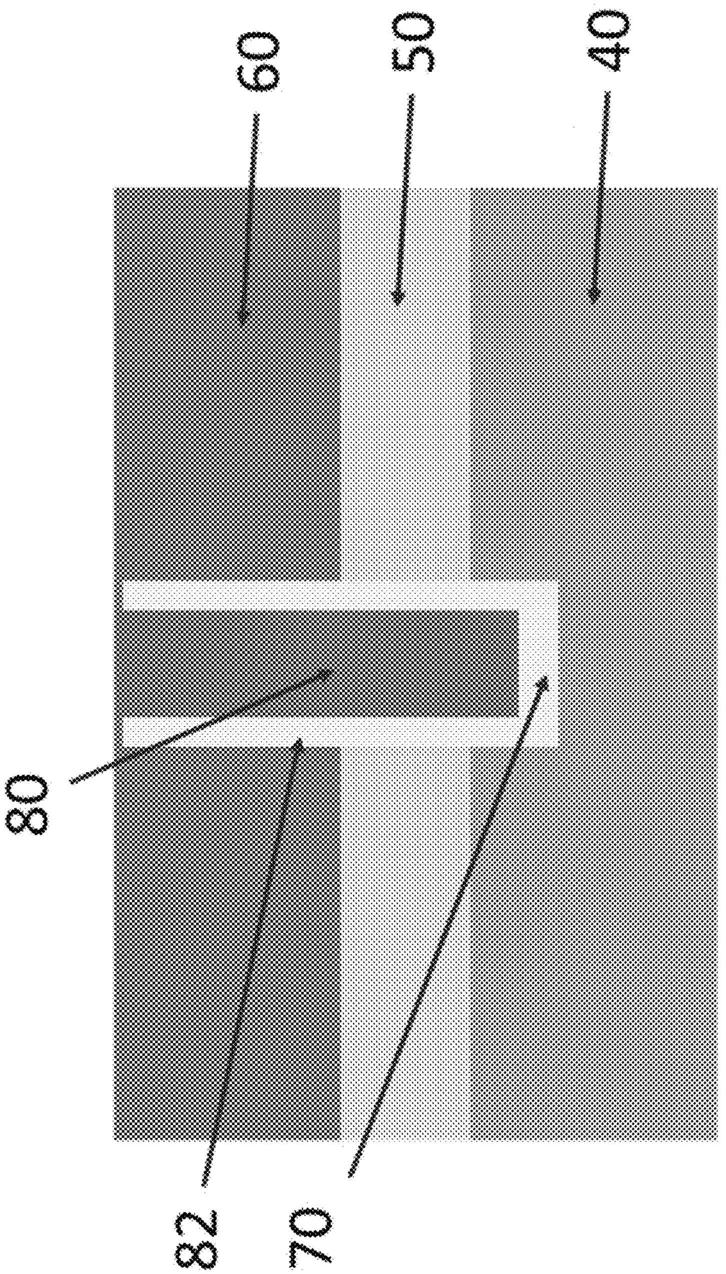

In FIG. 2B, a trench 70 may be formed by etching through the source SiC layer 60, through the second silicon layer 50 and at least partially into the first silicon layer 40. Once the trench 70 is formed, a gate oxide layer 82 may be deposited in the trench 70 along an inner edge of the trench 70. A gate 80 may be formed by depositing polysilicon into the trench 70 onto the gate oxide layer 82. In one or more examples, the gate oxide layer 82 and/or polysilicon may be formed in a portion of the trench 70.

Figure 2C:
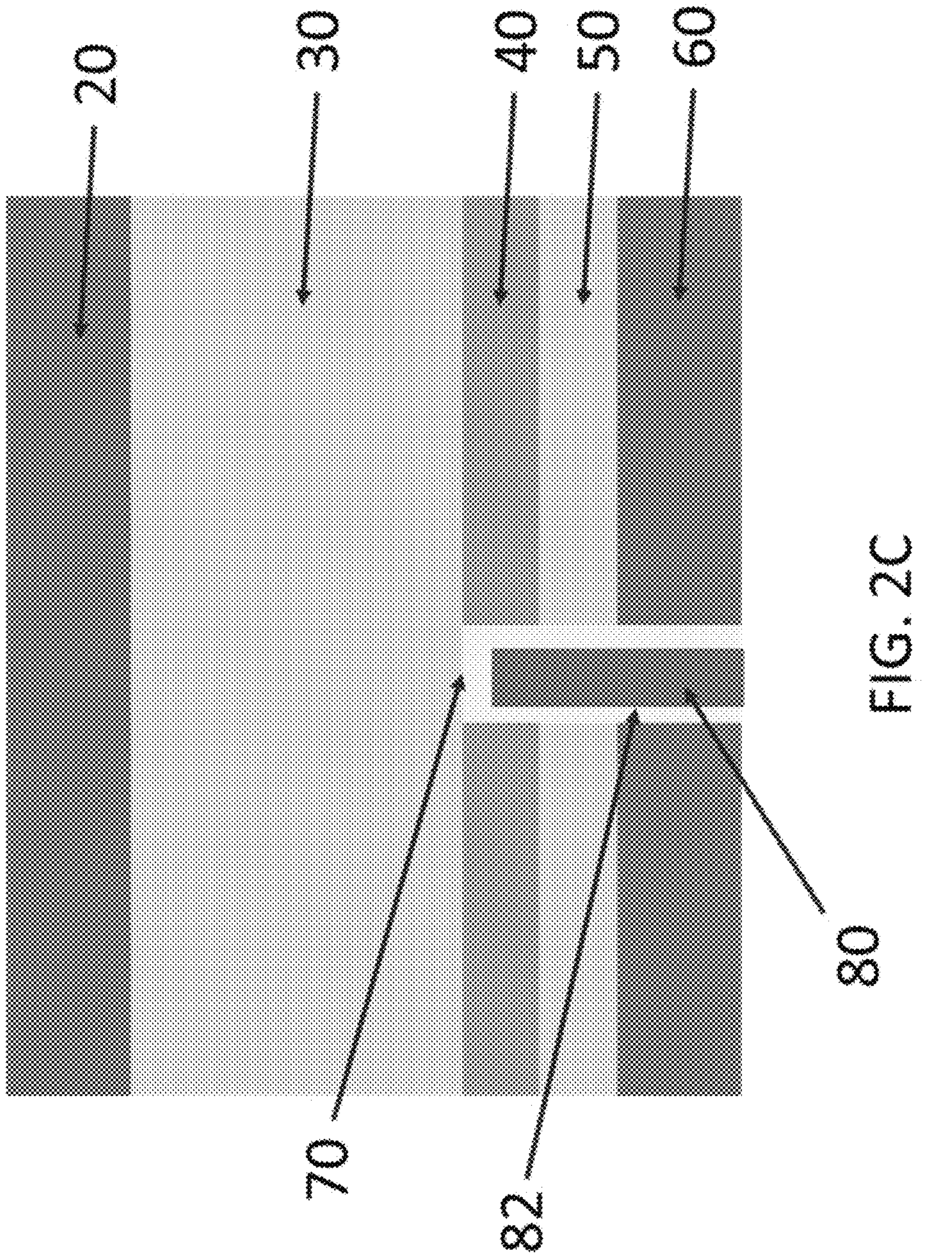

FIG. 2C shows a step of inverting the trench power semiconductor device 10 and forming a SiC drift layer 30 on a side of the first silicon layer 40 that is opposite from the second silicon layer 50. The SiC drift layer 30 may comprise silicon carbide having a second concentration of the first type dopant. A SiC drain layer 20 may be formed on the SiC drift layer 30. The SiC drain layer 20 may comprise silicon carbide having a first concentration of a first type dopant. The first concentration of the first type dopant in the SiC drain layer 20 may be greater than the second concentration of the first type dopant in the SiC drift layer 30. According to one or more examples, the SiC drift layer 30 or the SiC drain layer 20, or both, may be epitaxially grown or may be formed as separate wafer(s) and bonded to the first silicon layer 40.

Figure 2D:
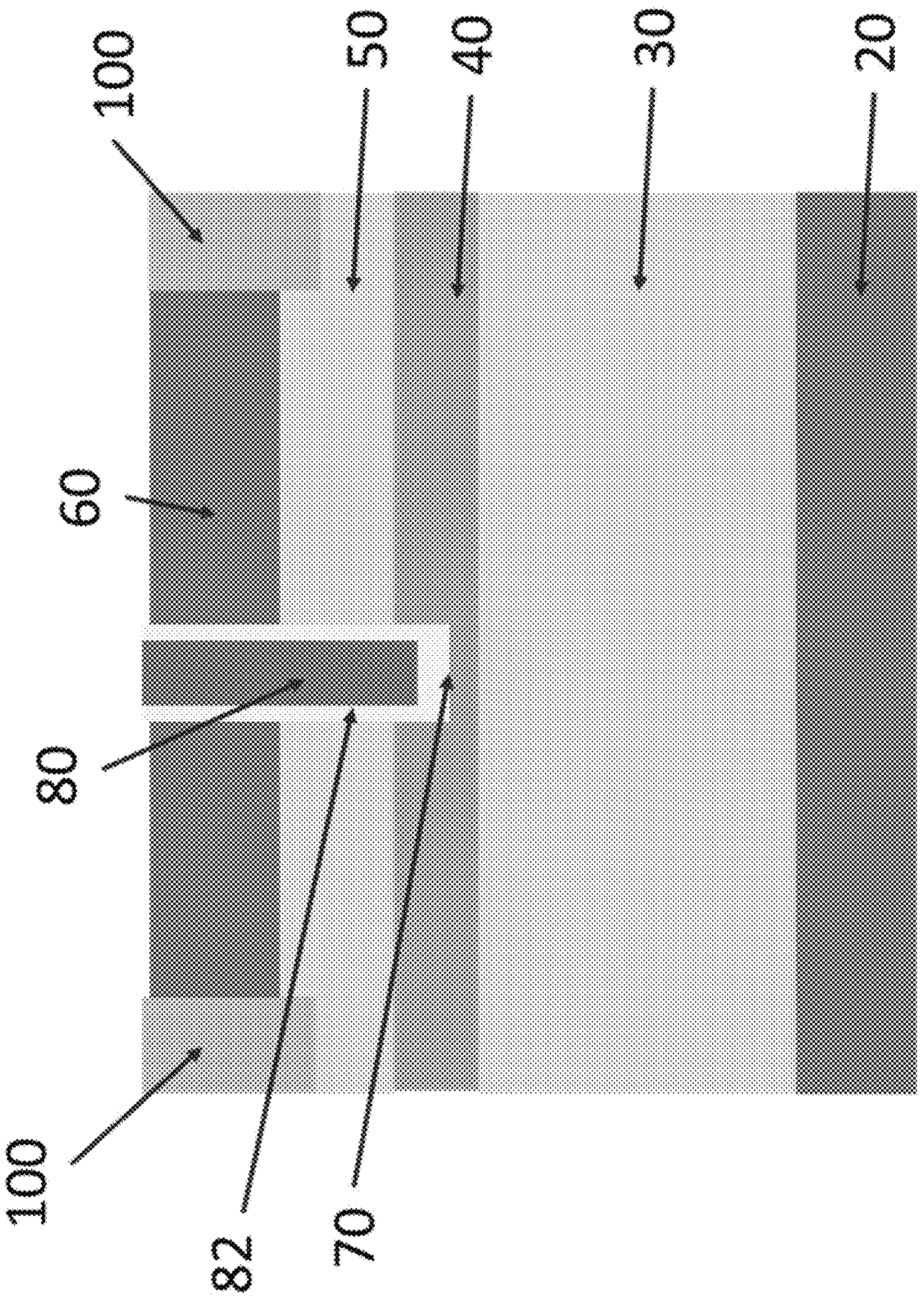

In the step shown in FIG. 2D, the trench power semiconductor device 10 is inverted again to its original orientation, and at least one body 100 is formed in the source SiC layer 60. As shown in FIG. D, two bodies 100 may be formed on opposite ends of the source SiC layer 60. The bodies 100 may be implanted in the source SiC layer 60, and may also extend at least partially into the second silicon layer 50. The bodies 100 may have a sixth concentration of the second type dopant. The sixth concentration of the second type dopant in the bodies 100 may be greater than the fourth concentration of the second type dopant in the second silicon layer 50.

Figure 2E:
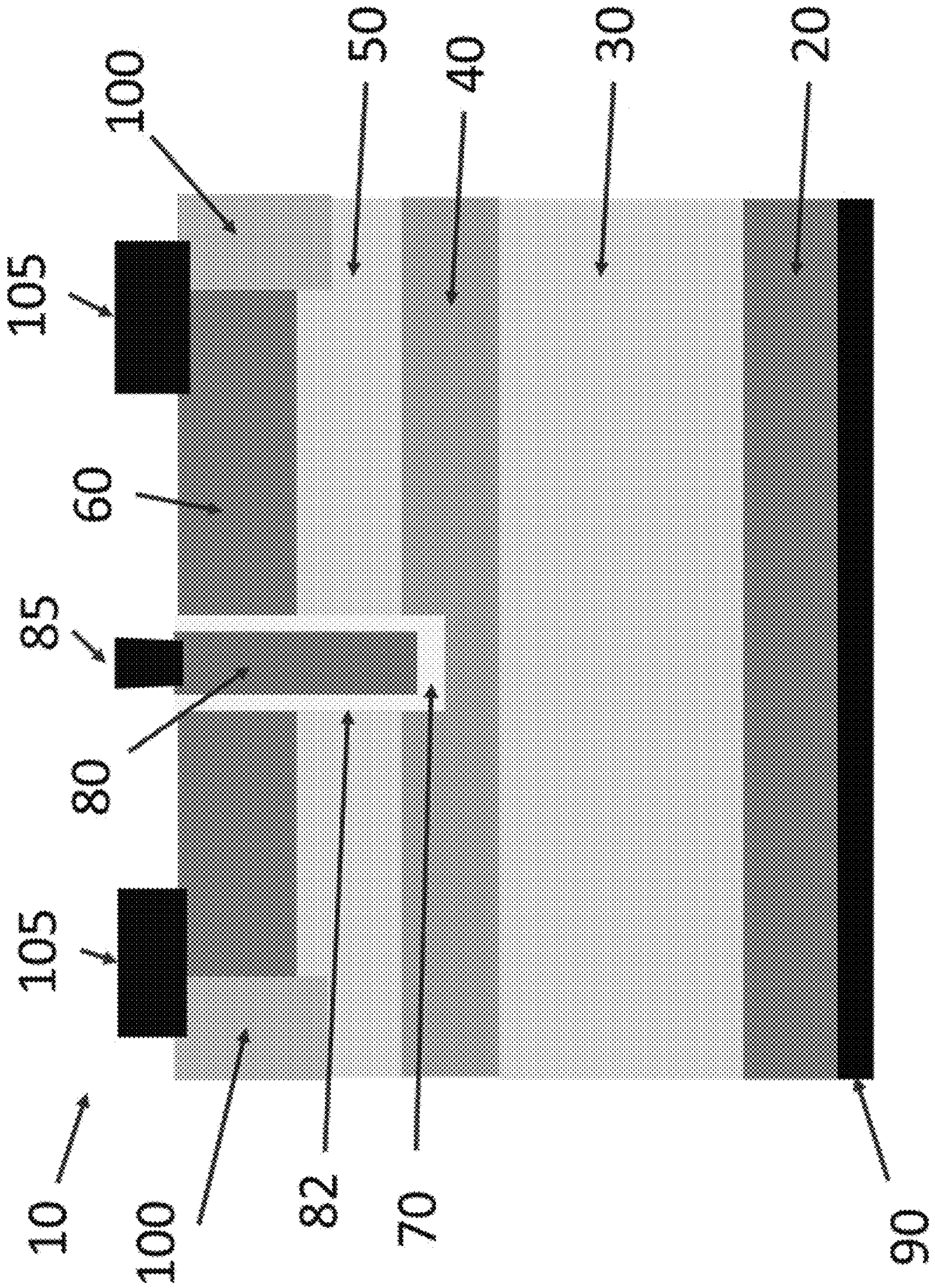

FIG. 2E shows a method step of forming a gate terminal contact 85 on the gate 80 in the trench 70. The gate 80 may be formed by depositing polysilicon into the trench 70 onto the gate oxide layer 82. In one or more examples, the gate oxide layer 82 and/or polysilicon may be formed in a portion of the trench 70. At least one source terminal contact 105 may be formed adjacent a respective at least one body 100 and a drain terminal contact 90 may formed on the SiC drain layer 20. The drain terminal contact 90 formed on an opposing face of SiC drain layer 20 from SiC drift layer 30. The trench power semiconductor device 10 of FIG. 2E may also include at least one source terminal contact 105 formed adjacent to a respective at least one body 100.

Various examples have been disclosed herein, in connection with the above description and the drawings. It will be understood that it would be unduly repetitious to literally describe and illustrate every combination and subcombination of these examples. Accordingly, all examples may be combined in any way and/or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A trench power semiconductor device comprising:

a silicon carbide drain layer;

a silicon carbide drift layer over the silicon carbide drain layer;

- a first silicon layer over the silicon carbide drift layer;
- a second silicon layer over the first silicon layer;
- a source silicon carbide layer over the second silicon layer;
- a trench formed through the source silicon carbide layer, through the second silicon layer and into at least partially the first silicon layer;
- a gate terminal contact formed on the trench; and
- a drain terminal contact formed on the silicon carbide drain layer.

2. The trench power semiconductor device of claim 1, wherein the silicon carbide drain layer comprises silicon carbide having a first concentration of a first type dopant.

3. The trench power semiconductor device of claim 2, wherein the silicon carbide drift layer comprises silicon carbide having a second concentration of the first type dopant, the second concentration different from the first concentration.

4. The trench power semiconductor device of claim 3, wherein the first concentration of the first type dopant is greater than the second concentration of the first type dopant.

5. The trench power semiconductor device of claim 4, wherein the first silicon layer comprises silicon having a third concentration of the first type dopant, the third concentration different from the first concentration.

6. The trench power semiconductor device of claim 5, wherein the second silicon layer comprises silicon having a fourth concentration of a second type dopant, the second type dopant different from the first type dopant.

7. The trench power semiconductor device of claim 6, wherein the source silicon carbide layer comprises silicon carbide having a fifth concentration of the first type dopant.

8. The trench power semiconductor device of claim 7, wherein the fifth concentration of the first type dopant is greater than the third concentration of the first type dopant.

9. The trench power semiconductor device of claim 8, comprising a body having a sixth concentration of the second type dopant, the sixth concentration different from the fourth concentration.

10. The trench power semiconductor device of claim 9, wherein the body comprises silicon carbide and wherein sixth concentration of the second type dopant is greater than the fourth concentration of the second type dopant.

11. A method for fabricating a trench power semiconductor device, the method comprising:

- forming a silicon carbide drain layer;
- forming a silicon carbide drift layer over the silicon carbide drain layer;
- forming a first silicon layer over the silicon carbide drift layer;
- forming a second silicon layer over the first silicon layer;
- forming a source silicon carbide layer over the second silicon layer;
- forming a trench through the source silicon carbide layer, through the second silicon layer and into at least partially the first silicon layer;
- forming a gate terminal contact on the trench; and
- forming a drain terminal contact on the silicon carbide drain layer.

12. The method of claim 11, wherein the silicon carbide drain layer comprises silicon carbide having a first concentration of a first type dopant.

13. The method of claim 12, wherein the silicon carbide drift layer comprises silicon carbide having a second concentration of the first type dopant, the second concentration different from the first concentration.

14. The method of claim 13, wherein the first concentration of the first type dopant is greater than the second concentration of the first type dopant.

15. The method of claim 14, wherein the first silicon layer comprises silicon having a third concentration of the first type dopant.

16. The method of claim 15, wherein the second silicon layer comprises silicon having a fourth concentration of a second type dopant, the second type dopant different from the first type dopant.

17. The method of claim 16, wherein the source silicon carbide layer comprises silicon carbide having a fifth concentration of the first type dopant.

18. The method of claim 17, wherein the fifth concentration of the first type dopant is greater than the third concentration of the first type dopant.

19. The method of claim 18, comprising a body having a sixth concentration of the second type dopant.

20. The method of claim 19, wherein the body comprises silicon carbide and wherein sixth concentration of the second type dopant is greater than the fourth concentration of the second type dopant.

* * * * *